United States Patent [19]

Hanabusa et al.

[11] 4,372,804
[45] Feb. 8, 1983

[54] METHOD FOR MAKING MULTILAYER PRINTED WIRING BOARD

[75] Inventors: Takayoshi Hanabusa; Kenji Yamamoto, both of Nagano; Shinzi Umemoto, Suzaka; Keiji Kurosawa; Mitsuo Yamashita, both of Nagano, all of Japan

[73] Assignee: Fujitsu Limited, Kawasaki, Japan

[21] Appl. No.: 250,177

[22] Filed: Apr. 2, 1981

Related U.S. Application Data

[63] Continuation of Ser. No. 64,122, Aug. 6, 1979, abandoned, which is a continuation of Ser. No. 820,565, Aug. 1, 1977, abandoned.

[30] Foreign Application Priority Data

Aug. 4, 1976 [JP] Japan ................................ 51-92360

[51] Int. Cl.³ ...................... B44C 1/22; C03C 15/00; C03C 25/06; C23F 1/02
[52] U.S. Cl. .................................. 156/631; 29/831; 29/841; 156/634; 156/659.1; 156/902; 174/68.5; 427/97; 428/902; 430/313; 430/315

[58] Field of Search ...................... 264/272; 174/68.5; 29/829, 831, 841, 846, 848; 156/150, 272, 252, 253, 629–634, 654, 655, 656, 659.1, 901, 902; 427/96, 97; 428/902; 430/313, 316, 318, 323, 329

[56] References Cited

U.S. PATENT DOCUMENTS

| | | | |
|---|---|---|---|
| 3,374,129 | 3/1968 | Boucher | 156/901 X |
| 3,466,206 | 9/1969 | Beck | 156/901 X |
| 3,627,902 | 12/1971 | Meyers | 174/68.5 |
| 3,688,396 | 9/1972 | Kilby et al. | 174/68.5 X |
| 3,947,957 | 4/1976 | Luttmer | 156/634 X |

Primary Examiner—William A. Powell
Attorney, Agent, or Firm—Daniel Jay Tick

[57] ABSTRACT

The thickness of copper foil at the land formation area of a copper clad laminate of a miniaturized high density circuit is made thicker than the remaining area to assure high reliability of connection between the through hole plating and the land.

8 Claims, 21 Drawing Figures

METHOD FOR MAKING MULTILAYER PRINTED WIRING BOARD

This is a continuation of application Ser. No. 064,122, filed Aug. 6, 1979, now abandoned, which, in turn, is a continuation of application Ser. No. 820,565, filed Aug. 1, 1977, now abandoned.

BACKGROUND OF THE INVENTION

The present invention relates to a multilayer printed wiring board.

It is invariably necessary to make thinner the copper foil on the substrate of a printed wiring board due to current pattern formation technology, in order to realize a super high density circuit by using a conventional printed wiring board. When the copper foil is made thinner, however, the thickness of land on which a through hole plating is provided must be as much thinner. The junction area of the through hole plating and the land becomes small therefore, so that plating is easily peeled off. As a result, the reliability of connection cannot be insured.

The reliability of connection between the through hole plating and the land may be assured by making the thickness of copper foil of each laminate thick. However, such a configuration makes the miniaturization of a high density circuit difficult and the overall thickness of the super multilayer substrate becomes very thick. In addition, the drilling of through holes for establishing electrical connection between laminates becomes very difficult due to accuracy requirements. Furthermore, soldering for mounting electrical parts also becomes very difficult.

The printed wiring board of the invention permits the accurate forming of a miniaturized high density circuit by using a copper clad laminate in which the thickness of the copper foil at the land formation area is made thicker than the remaining area, as the laminates. This assures high reliability of connection between the through hole plating and the land.

The multilayer printed wiring board of the invention is often used in the electrical wiring of electronics devices. The manufacture of a multilayer printed wiring board may be roughly classified into the Subtractive Method and the Additive Method. The Subtractive method is generally utilized for a printed wiring board of which reliability and a high density characteristic are especially required for use in computer and communications equipment. A multilayer printed wiring board manufactured by the Subtractive Method is formed as follows.

A predetermined circuit pattern is formed on a copper clad board by an etching process for copper foil. The copper clad board is then sequentially laminated up to the specified layers with pre-preg as a bonding agent in order to form an intermediate layer. The copper clad board is then laminated again with the pre-preg as the surface layer. Thus, a through hole is drilled through the lands of the intermediate layer and the surface layer. Thereafter, the surface circuit pattern is formed and the through hole is plated in order to provide continuation between the surface circuit pattern and the intermediate circuit pattern.

The copper clad laminate used for the multilayer printed wiring board may generally be provided by bonding copper foil on a plate substrate of epoxy resin utilizing glass fiber as the core material. Therefore, the circuit pattern is formed on the intermediate layer by providing a photo resist pattern corresponding to a circuit pattern consisting of the land and the circuit conductor on the copper foil of the copper clad laminate and then etching the copper foil.

The integration of the multilayer printed wiring board becomes high in density and the miniaturization of the circuit becomes as high in density, so that the clearance of the circuit conductor becomes narrow. As a result, the pattern accuracy of the mask film, produced by art work, requires considerable improvement. Furthermore, a considerable improvement is required in the pattern generation accuracy of the etching process.

An ultra-thin copper clad laminate which is just suitable for high density and circuit miniaturization has been often used, recently. The ultra-thin copper clad laminate uses a copper foil having a thickness of 15 micrometers or $\mu$m, or less. This is considerably thinner than the existing thickness of 35 $\mu$m. This laminate therefore may prevent an overhang phenomenon in the pattern etching process, which occurs in a thick copper foil. Furthermore, since the copper foil itself is very thin, the final thickness after lamination may be considerably thinner than the existing thick copper clad laminate. In the manufacture of an ultra-thin multilayer printed wiring board with 20 to 30 layers by using the existing thick type copper clad laminate, for example, the final thickness becomes as thick as 3 to 5 millimeters or mm. A thick lamination produces a bad effect in the process after laminations. In other words, the through hole drilling process and soldering for mounting parts become difficult.

The foregoing explains why ultra-thin copper clad laminate has often been used recently. However, a problem has recently arisen due to the use of ultra-thin copper clad laminate. The problem concerns the reliability of the connection between the land and the through hole, and is emphasized by the thinness of the copper foil. That is, when an ultra-thin copper clad laminate is used, the reliability of the connection between the area exposed to the through hole on the land formed by the ultra-thin copper foil and the through hole plating is drastically deteriorated, since the plating is likely to peel off because the bonding area is very very narrow.

The principal object of the invention is to provide a multilayer printed wiring board which is suitable for manufacturing a high density miniaturized circuit pattern and insures high reliability.

An object of the invention is to provide a multilayer printed wiring board which assures excellent workability in the through hole drilling process and in the soldering process for mounting parts.

Another object of the invention is to provide a multilayer printed wiring board of satisfactorily high density.

Still another object of the invention is to provide a multilayer printed wiring board having a miniaturized circuit pattern formed with satisfactory accuracy.

BRIEF SUMMARY OF THE INVENTION

The aforedescribed problems are solved by the multilayer printed wiring board. The most distinctive characteristic of the multilayer printed wiring board of the invention is that a copper clad laminate is used. Copper foil is bonded to the flat surface of a base substrate of epoxy resin such as, for example, a resin using glass fiber as the core material. The copper foil has land projecting into the base substrate. That is, the land is buried in a land formation area of the substrate.

The copper clad laminate having buried land may be provided by the following processes. Copper foil with land may ordinarily be formed by plating at the land forming area. It may also be formed by removing copper foil from the area other than the land forming area of the ordinarily used comparatively thick copper foil, by means of etching to a specific depth, and then bonding such copper foil with land to the base substrate.

A very high density circuit pattern may thus be obtained by forming a surface circuit pattern and an intermediate circuit pattern using the copper clad laminate with buried land. Furthermore, a multilayer printed wiring board is provided which assures high reliability of connection between the land and the through hole, although this has been a very important problem as the copper foil is finished thinner and thinner.

In accordance with the invention, a method of manufacture of a multilayer printed wiring board having a copper clad laminate consisting of a plate of base material having copper foil thereon, said copper foil of said multilayer printed wiring board being etched to form land and a circuit conductor, a plurality of said copper clad laminates being layered, through holes being drilled through each land and plating being provided for the through holes, comprises the step of forming the copper clad laminate with a thickness of the land forming area greater than the remaining area.

The method of manufacture of a multilayer printed wiring board further comprises the steps of forming the copper foil on a temporary substrate, precipitating copper to a specific thickness on the land forming area of the copper foil by plating, covering the copper foil after plating with a bonding agent of semi-hardened resin, printing the copper foil on the bonding agent by thermally bonding the temporary substrate and said bonding agent, and removing the temporary substrate.

The method of manufacture of a multilayer printed wiring board further comprises the steps of covering the copper foil with a photo resist, first exposing the resist via a mask film having a common land pattern regularly arranged in the form of a lattice, second exposing the resist via a mask film having an intrinsic circuit pattern consisting of a specified land pattern and circuit conductor pattern, developing the twice-exposed photo resist, removing the resist at the specified land forming area, and plating copper on only the land forming area of the copper foil.

The method of manufacture of a multilayer printed wiring board further comprises the steps of covering the copper foil with a resist of only the circuit conductor pattern extended up to the land forming area of the copper foil to form the circuit conductor, and etching the copper foil until the surface of the plate of base material is exposed.

The method of manufacture of a multilayer printed wiring board further comprises the steps of forming the copper foil on a temporary substrate, uniformly etching to a specific depth the area of the copper foil other than the land forming area of the copper foil, covering the copper foil after etching with a bonding agent of semi-hardened resin, and printing the copper foil on the bonding agent by thermally bonding the temporary substrate and the bonding agent.

The method of manufacture of a multilayer printed wiring board further comprises the steps of covering the copper foil with a photo resist, first exposing the resist via a mask film having a common land pattern regularly arranged in the form of a lattice, second exposing the resist via a mask film having an intrinsic circuit pattern consisting of a specified land pattern and circuit conductor pattern, developing the twice-exposed photo resist to maintain the resist on the specified land forming area, and uniformly etching to the specific depth the area of the copper foil other than the land forming area of the copper foil.

The resist is exposed via the mask film having a common land pattern regularly arranged in the form of a lattice and the mask film has an intrinsic pattern consisting of a specified land pattern and circuit conductor pattern in superimposed relation.

The method of manufacture of a multilayer printed wiring board further comprises the step of providing the bonding agent by forming a multilayer structure including impregnating a semi-hardened epoxy resin into a sheet of glass fiber base material and positioning a sheet of glass paper on the sheet of glass fiber base material.

The method of manufacture of a multilayer printed wiring board further comprises the steps of removing glass fiber base material from an area corresponding to the land forming area, and providing the semi-hardened epoxy resin impregnated glass fiber base material in the cleared area.

BRIEF DESCRIPTION OF THE DRAWINGS

In order that the invention may be readily carried into effect, it will now be described with reference to the accompanying drawings, wherein.

DETAILED DESCRIPTION OF THE INVENTION

Figure 1:
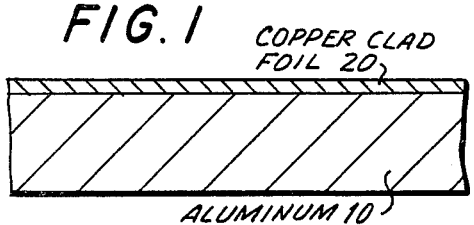
FIGS. 1 to 5 are cross-sectional views illustrating a method of manufacture of a copper clad laminate of the multilayer printed wiring board of the invention.
Figure 2:
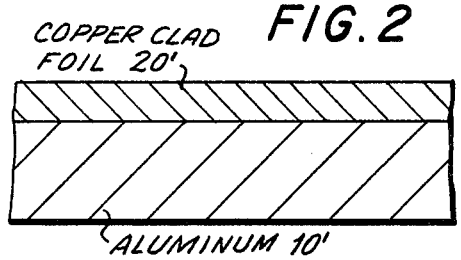

FIGS. 1 to 5 explain a method of manufacture of a copper clad laminate to be used for the multilayer printed wiring board of the invention. In FIGS. 1 to 5, the manufacturing process is indicated by using the double-sided copper clad laminate as an example. In FIGS. 1 to 5, an aluminum plate 10 having a thickness of 50 μm has a copper clad foil 20 having a thickness of 10 μm, for example, coated on an entire surface thereof (FIG. 1). Furthermore, copper clad foil 20' having a thickness of 40 to 80 μm, for example, is coated on an entire surface of the aluminum plate 10' (FIG. 2). Land 30 is formed by projection of the copper clad foil 20 into the predetermined land forming area thereof. A semi-hardened resin 40 is known as pre-preg and is provided by impregnating epoxy resin into a glass fiber base substrate.

First explained is a method of manufacture of a copper clad laminate with land by using a comparatively thin copper clad foil, shown in FIG. 1. The copper clad foil 20 provided on the aluminum plate 10 by copper plating is polished and a reference hole is drilled for positioning. Thereafter, the surface is treated for degreasing. A photo resist of dry film is then bonded to the copper clad foil 20. A mask film having a print of a predetermined land pattern is then placed over the dry film. The resist on the area corresponding to the land forming position is then removed by baking and developing processes. The land patterns corresponding to every land forming position are printed on the mask film irrespective of the finally formed circuit pattern. The mask film is hereinafter described in detail.

Figure 3:
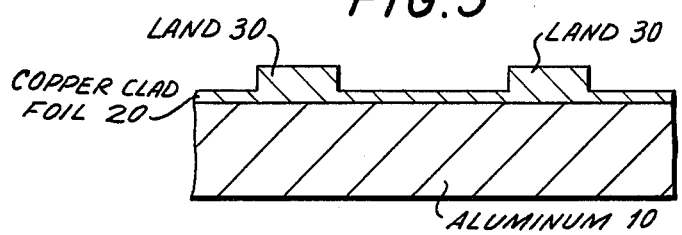

After the resist is removed from the land forming area, the copper plating is provided in a thickness of 30 to 70 μm. The land 30 projecting from the copper foil 20 may thus be formed. The unwanted resist is removed. This condition is shown in FIG. 3. Thereafter, plating or oxidization is utilized to smooth the copper surface.

Figure 5:
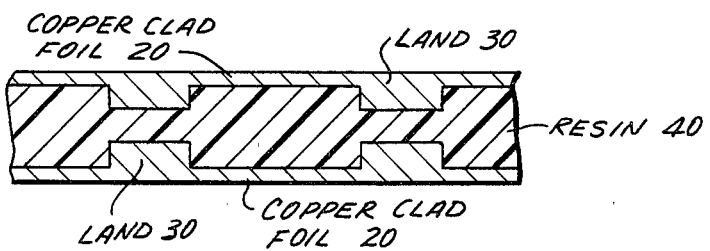

Two sheets of substrate provided by the aforedescribed process are arranged face to face with the aluminum plates 10 positioned on both sides, as shown in FIG. 3. The two sheets of substrate are secured by pre-preg 40 (FIG. 3) of a thickness of 0.1 mm and are subjected to thermal bonding. After the pre-preg 40 is compressed and hardened as the base substrate, both aluminum plates 10 are peeled off, so that the copper clad laminate with land 30 which is buried in the sides of the base substrate is provided as shown in FIG. 5. In this example, a copper clad laminate 0.1 mm thick may be provided.

The copper clad laminate with buried land, shown in FIG. 5, may be obtained by using comparatively thick copper clad foil 20', as shown in FIG. 2. After the surface polishing, drilling of the standard hole and degreasing treatment of the copper foil 20', the photo resist is bonded to said copper clad foil. The mask film on which the specified land pattern is printed is laminated. Then, they are subjected to the baking and development processes and the resist on the area other than the land forming area is removed. In the area other than the land forming area, etching at a specified thickness such as, for example, 10 μm is provided by a later etching process. Thereafter, unwanted resist is removed. The result is a copper laminate providing land 30 projecting from the copper clad foil 20, as shown in FIG. 3. Two sheets of substrate, provided as hereinbefore described, are arranged face to face via the pre-preg and are subjected to thermal bonding. A copper clad laminate with land 30 projecting into the side of the substrate, as shown in FIG. 5, may be provided in the same manner.

Figure 6:
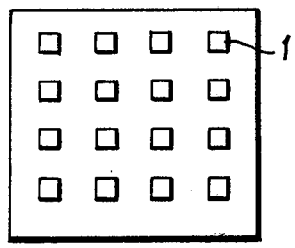
FIGS. 6 and 7 are plan views of mask films used when land projecting from the copper clad foil of FIG. 3 is formed.
Figure 7:
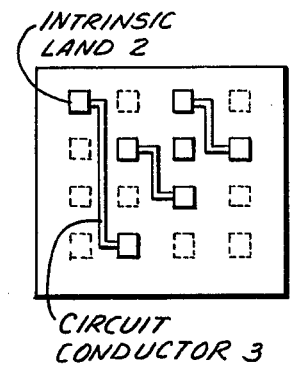

FIGS. 6 and 7 show mask films used when land projecting from the copper clad foil, as shown in FIG. 3, is formed. FIG. 6 is a plan view of a mask film having a common land pattern 1 in which the land is arranged regularly in the form of a lattice. The common land pattern mask film of FIG. 6 includes all land patterns and meets a demand for any circuit pattern. A mask film of the type of FIG. 6 may be used in common so long as only one mask is prepared.

FIG. 7 is a plan view of a mask film having an intrinsic circuit pattern required for forming a circuit pattern on the surface of a copper clad laminate by a photo-etching method. The mask film having such intrinsic circuit pattern is essentially required to form a circuit pattern for the copper clad laminate to be used as the intermediate layer, surface layer of the multilayer printed wiring board. The circuit pattern is therefore a peculiar one, manufactured according to the circuit design on the mask film of such type. The circuit pattern of the film consists of necessary intrinsic land 2 and a circuit conductor 3. This means that the film has an intrinsic land pattern to be buried. The broken lines in FIG. 7 show the areas where the common land will be.

FIGS. 8a, 8b, 8c, 8d and 8e illustrate a method of manufacture of the copper clad laminate of FIG. 5 with the intrinsic land 30 buried in a side of the base substrate by using the mask film of FIGS. 6 and 7. The method shown in FIGS. 8a to 8e is also used when a copper clad laminate having projecting land is manufactured by an etching process for the comparatively thick copper clad foil shown in FIG. 2.

An embodiment of a matrix arrangement wherein buried land is provided in common for every land forming position has been explained with reference to FIGS. 1 to 5. With regard to FIGS. 6, 7 and 8a to 8e, however, an embodiment which is effective in obtaining a copper clad laminate having the land buried only at the land forming position of the intrinsic circuit pattern is hereinafter explained in the sequence of the method of manufacture.

Liquid type or film type positive photo-sensitive resist 50 is first coated on the entire part of the copper clad foil 20' formed on the aluminum 10', shown in FIG. 2. The common land pattern mask film shown in FIG. 6 is placed over the resist and the positive type photo resist 50 is exposed to the light. The positive type resist is then left in a dark room and the mask film with the intrinsic circuit pattern shown in FIG. 7 is placed upside down over the resist 50. The resist 50 is thus exposed to the light again.

The mask film having the intrinsic circuit pattern shown in FIG. 7 is the same as currently used mask film, that is, the mask film for exposing the resist coated on the surface of copper foil of the copper clad laminate in which the copper foil thickness is the same in the land and circuit pattern. Therefore, the land patterns to be formed are matched by placing the film upside down in view of using such film for exposing the aforedescribed resist coated on the rear side of the copper foil.

Figure 8A:
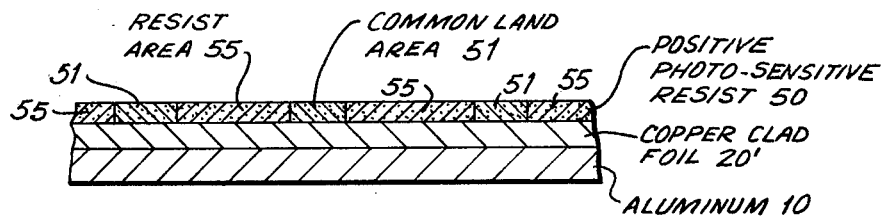
FIGS. 8a, 8b, 8c, 8d and 8e are cross-sectional views illustrating a method of manufacture of the copper clad laminate of FIG. 5 with the intrinsic land buried in a side of the base substrate by using the mask film of FIGS. 6 and 7.
Figure 8B:
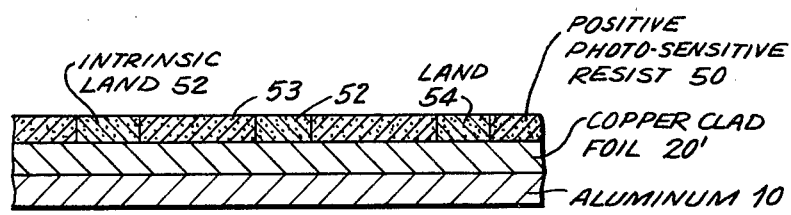

When the resist coated on the rear side of the copper foil is baked twice with the common land pattern mask film and the intrinsic circuit pattern mask film as hereinbefore explained, the resist area 55 other than the common land area 51 is exposed by the first exposure as shown in FIG. 8a, and then the other lands 54, not including the land 52 among the not yet exposed common land group, are exposed by the second exposure, as shown in FIG. 8b. In this case, the area 53 of the circuit conductor related to the intrinsic land 52 is also not exposed by the second exposure. However, the area 53 is already exposed by the first exposure process shown in FIG. 8a.

Therefore, two exposures selectively leave unexposed only the resist area of the intrinsic land pattern, as in the case of a single exposure using the mask film having only the intrinsic land pattern, but exposes the other resist area. This means that the invention permits the formation of a pattern resist of intrinsic buried land only by properly combining the intrinsic circuit pattern mask film required for making an ordinary circuit pattern often used generally and a common land pattern mask film, without the need to make an intrinsic land pattern mask film. However, in order to realize this process, at least a sheet of common land pattern mask film, shown in FIG. 6, must be manufactured. This film may be used for all cases in common without any problem.

Figure 4:
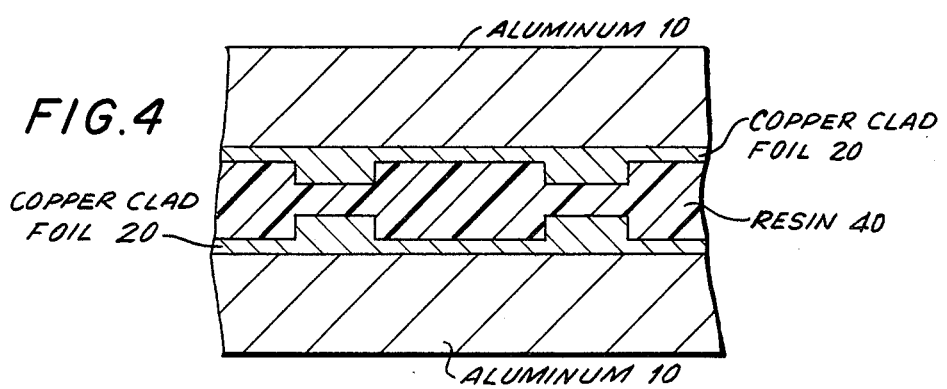
Figure 8C:
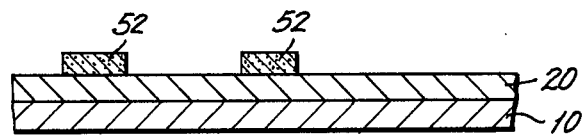
Figure 8D:
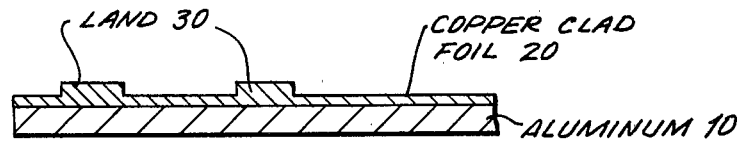
Figure 8E:
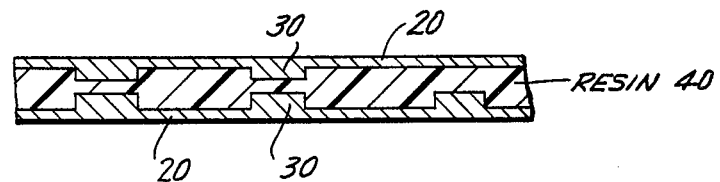

After the second exposure, the resist 50 is developed as in the usual method. Thereby, the desired resist 52 consisting of only the intrinsic land pattern is maintained on the copper foil. This condition is shown in FIG. 8c. Then, when unwanted resist is removed by the etching process for the copper foil over the resist 52, the copper foil 20 with the intrinsic buried land 30 projecting therefrom may be formed. This condition is shown in FIG. 8d. The copper foil 20 thus provided, with land projecting into the aluminum plate 10, is then laminated with pre-preg, as shown in FIG. 4, and subjected to thermal bonding. Thereafter, the aluminum plate 10 is removed. Thus, a copper clad laminate with land peculiar to a circuit pattern buried in the base substrate, as shown in FIG. 8e, is provided.

In the aforedescribed method, the first exposure using the common land pattern mask film and the second exposure using the intrinsic circuit pattern mask film are performed in different processes. It is possible, however, to complete the exposure only once by superimposing the common land pattern mask film and intrinsic circuit pattern mask film.

The copper clad laminate with land thus obtained as hereinbefore described permits the adjustment of the thickness of the land buried in the substrate and the copper foil area on which other circuit conductors are formed. Therefore, the thickness of the circuit conductor formed on the copper foil area may be determined as desired, considering high density and miniaturized circuit configuration. On the other hand, the thickness of the land may also be determined to a value which insures a sufficient joint with the through hole plating. The copper clad laminate with land is thus very useful for manufacturing each circuit pattern layer of a multilayer printed wiring board with a high mounting density.

A copper clad laminate with land which realizes the aforedescribed high density circuit pattern and connection between the through hole plating and the land without difficulty is very useful material for a super or ultra-multilayer printed wiring board having super or ultra high density. For such application, the copper clad laminate with land must be double sided and its thickness must be very very thin.

Figure 9:
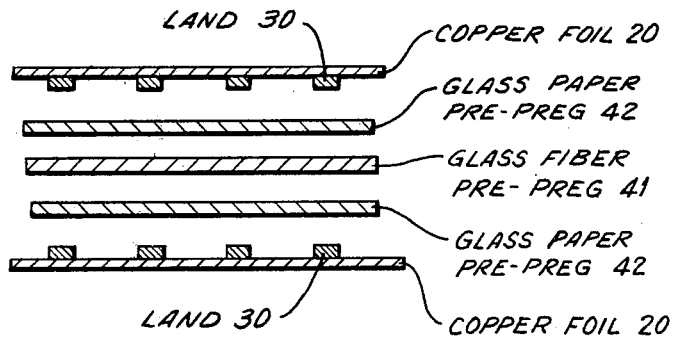
FIG. 9 is an exploded cross-sectional view of an improved embodiment of the copper clad laminate of FIG. 5.

A further improved embodiment of the multilayer printed wiring board of the invention is shown in FIG. 9. The copper clad laminate with land of FIG. 9 may be made thinner. Accordingly, it is very useful for application in an ultra-thin multilayer printed wiring board. In FIG. 9, copper foil 20 has land 30 projecting therefrom. The aluminum plate is not illustrated in FIG. 9. Pre-preg 41 is obtained by impregnating a semi-hardened epoxy resin into a glass fiber base material. Pre-preg 42 is of the glass paper family.

The pre-preg 41 of the embodiment of FIG. 9 is of the epoxy family and consists of a sheet of glass fiber base material, in a simplified definition. In practice, however, the land projected from the copper foil is 30 to 70 μm in thickness and has a considerably uneven surface. For this reason, layers of two pre-pregs are provided. This is because a sheet of pre-preg is insufficient in epoxy resin content to flatten the surface.

In the case of a pre-preg of epoxy resin of glass fiber base material, the epoxy resin is hardened by a heating and bonding process, but the thickness at such time depends upon the thickness of glass fiber used as the base material. Generally, when 8 sheets of pre-preg of this type are layered, heated and compressed, the thickness becomes about 1.6 mm when it is hardened. A pre-preg of this type may be manufactured by the following process.

A glass fiber belt is dipped into varnish dissolved in a solvent of epoxy resin and then removed. During such time it is heated and the epoxy resin impregnated in the glass fiber is semi-hardened. According to this manufacturing method, impregnation of epoxy resin is about 40 to 50% because of the relation with impregnation capacity of the glass fiber. Therefore, as hereinbefore mentioned, a sheet of pre-preg of the glass fiber family is insufficient in epoxy resin content to flatten the considerably unsmooth surface. When two sheets of pre-preg are used, the epoxy resin is sufficient in content to flatten the surface, but the final thickness of the copper clad laminate with land as finished, becomes as thick, since two sheets of glass fiber are used.

It is desired to make the thickness of the double-sided copper clad laminate with land to be used for a super or ultramultilayer printed wiring board as thin as 0.10 mm or less. However, when two sheets of glass fiber family pre-pregs are used, it is difficult to obtain such a thinness. Further improvement has been made in order to obtain an ultra-thin copper clad laminate with land. FIG. 9 shows the improved embodiment.

As shown in FIG. 9, instead of two sheets of glass fiber family pre-preg, three layers of pre-preg are utilized. A sheet of glass fiber pre-preg 41 is sandwiched between two sheets of glass paper pre-preg 42. The two sheets of glass paper pre-preg 42 are in turn sandwiched between a pair of copper foils 20 with land 30. The elements 41, 42 and 20 are heated and bonded into one unit.

A pre-preg called glass paper base material epoxy resin is a typical glass paper family pre-preg. This pre-preg may be obtained by the following process. Glass fiber is cut into a large number of small chips, which are compressed and formed into a paper. Epoxy resin is impregnated into the paper by the same method as the glass fiber family pre-preg hereinbefore mentioned, and the epoxy resin impregnated paper is semi-hardened. The aforedescribed pre-preg is thereby obtained. The glass paper has a significantly large impregnation capacity as compared with the glass fiber, so that the magnitude of impregnation of the epoxy resin is about 70 to 80%. In the glass family, the magnitude of impregnation is 40 to 50%. Since the glass paper is flexible for deformation and thinner than the glass fiber, the laminate using the structure of three layers of pre-preg is very thin, as shown in FIG. 9.

If it is required to form the base material 1.6 mm thick with glass paper family pre-preg, about 11 to 12 sheets must be laminated and heated for thermal bonding. On the other hand, as hereinbefore described, the thickness becomes 1.6 mm even if 8 sheets of glass fiber family pre-preg are laminated. The glass paper family pre-preg contributes to thinning the thickness of the glass paper family pre-preg to the aforedescribed extent. Furthermore, the impregnation content of epoxy is sufficient, so that the surface of the copper foil may be smoothened with the epoxy resin by utilizing the aforedescribed three layer pre-preg structure. If the unevenness cannot be corrected, an undesirable void, gap or space exists between the base material and the copper foil.

If a purpose of the invention is to use epoxy resin to fill unevenness at the surface of the copper foil and to maintain the thickness of the laminate thin, such purpose is readily attained by heating two copper foils with land and two sheets of glass paper family pre-preg for thermal bonding. This provides a laminate which is much thinner in thickness than the embodiment of FIG. 9, since there is no glass fiber family pre-preg used. However, if only glass paper family pre-preg is used, the laminate obtained has the drawback that is easily deformed by the heat of the succeeding circuit pattern formation and lamination process of the intermediate layer, or of the soldering process at the time parts are mounted. Thus, size accuracy cannot be attained.

The embodiment of FIG. 9 thus utilizes the merits of the glass paper family pre-preg, that is, thinness and large capacity of epoxy impregnation, and the merit of the glass fiber family pre-preg, which is the assurance of size accuracy, effectively. The copper clad laminate with land is thereby obtained, meeting the defects of the pre-pregs by realizing thinness and by filling unevenness on the copper surface with sufficient epoxy resin.

Figure 10:
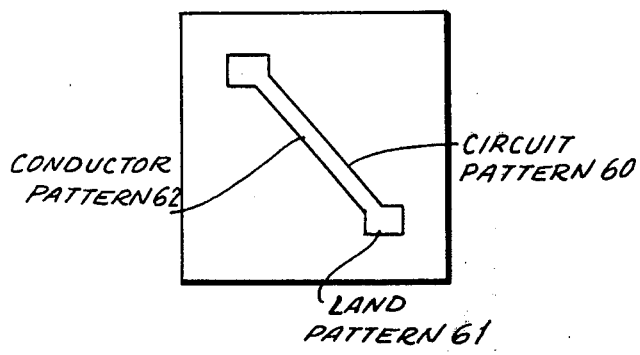
FIG. 10 is a plan view of the circuit pattern of an existing mask pattern film.
Figure 11:
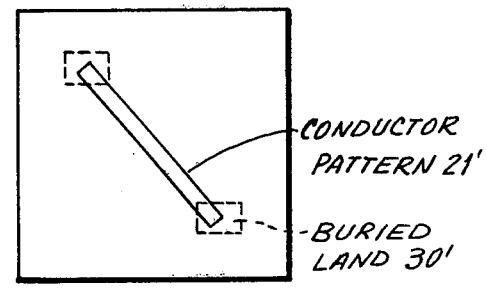
FIG. 11 is a plan view of the circuit pattern of the mask pattern film used for the copper clad laminate with the land of the invention.

The process for actually manufacturing the circuit pattern of each layer by utilizing the copper clad laminate with land of the present invention is explained as follows. FIG. 10 is a plan view of the circuit pattern of an existing mask pattern film. FIG. 11 is a plan view of the circuit pattern of the mask pattern film, corresponding to FIG. 10, used for the copper clad laminate with land obtained by the present invention. In accordance with the invention, as is clear from a comparison between FIGS. 10 and 11 for a mask pattern film, a land pattern 61 which is in common existence is not prepared. Instead, only a conductor pattern 21', which is extended up to the area corresponding to a buried land 30', is manufactured. Actually, a circuit pattern 60, consisting of the land pattern 61 and the conductor pattern 62 extending therefrom, is manufactured.

Figure 12:
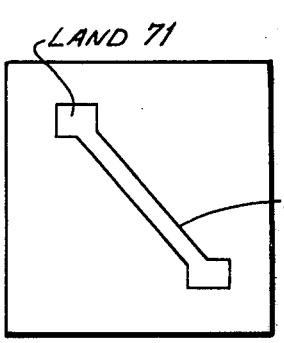
FIG. 12 is a plan view of a circuit pattern provided by an existing method.

FIG. 12 is a plan view of a circuit pattern provided by an existing method. That is, the resist pattern is first formed on the resist film by exposure, development and printing by using the mask pattern film shown in FIG. 10 for a copper clad laminate without land or a flat laminate. The circuit pattern is then formed by the etching process.

Figure 13:
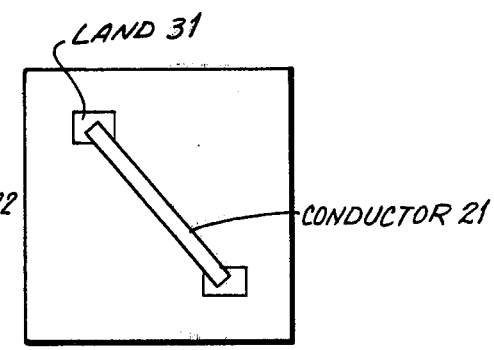
FIG. 13 is a plan view of the circuit pattern formed on the copper clad laminate with land by utilizing the mask pattern file of FIG. 11 in accordance with the invention.

FIG. 13 is a plan view of the circuit pattern formed on the copper clad laminate with land by utilizing the mask pattern film of FIG. 11 in accordance with the invention. As may be understood from FIGS. 12 and 13, in the case of the existing circuit pattern, the land 71 and the conductor surface 72 are in the same plane. In the case of the invention, however, the conductor surface 21 is at a higher level than the land surface 31. In other words, the conductor is elevated higher than the land surface and at the same time it extends into the land area.

Figure 14A:
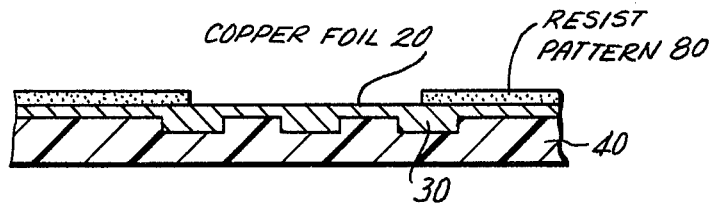
FIG. 14a is a cross-sectional view of a copper clad laminate with buried land before the etching process of the invention.
Figure 14B:
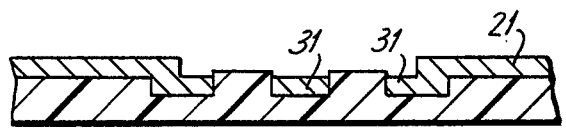
FIG. 14b is a cross-sectional view of a copper clad laminate with buried land after the etching process of the invention.

FIGS. 14a and 14b show a cross-section of a copper clad laminate with buried land before and after the etching process of the invention, respectively. In FIGS. 14a and 14b, a single sided copper clad laminate with land is shown in order to simplify the explanation. As shown in FIG. 14a, in accordance with the invention, there is no land pattern. A resist pattern 80, of which the conductor pattern extends to the area corresponding to the land pattern, is formed on the copper clad laminate with land. The copper foil 20 is then etched until the surface of the base material 40 is exposed. FIG. 14b is a cross-section of the copper clad laminate with buried land after the etching process. As hereinbefore explained, a land pattern and a conductor pattern elevated higher than the land pattern are formed.

Figure 15:
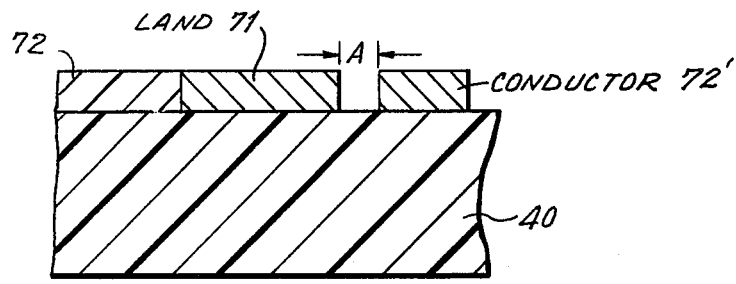
FIG. 15 is a cross-sectional view explaining circuit clearance of an existing circuit pattern.
Figure 16:
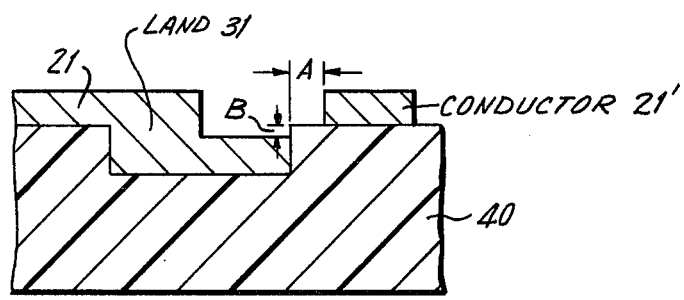
FIG. 16 is a cross-sectional view explaining circuit clearance of the circuit pattern of the invention.

FIG. 15 is a cross-sectional view explaining circuit clearance of an existing circuit pattern. In accordance with the existing method, shown in FIG. 15, the clearance A between the land 71 and the adjacent conductor 72' is only two-dimensional on the surface of the base material 40. In the method of the invention, however, as shown in FIG. 16, the clearance A+B between the land 31 and the adjacent conductor 21' is three-dimensional, extending over the surface of the base material 40 and in the thickness direction of said base material. Therefore, even when the two-dimensional clearance on the base material is small, the clearance B may compensate for pattern accuracy since the additional clearance B is in the thickness direction of the base material. This clearance in the thickness direction may be set at the desired dimension by adjusting the etching depth. That is, land buried lower than the surface of the base material may be adjusted to the desired dimension by etching.

In accordance with the invention, the land pattern forming process may be omitted in the step of forming the mask pattern film, so that the necessary art work may be much simplified. Furthermore, in comparison with the use of film having a land pattern and conductor pattern shown in FIG. 10 with the copper clad laminate with land of the present invention, the use of the film shown in FIG. 11 is of such advantage that there is no need to consider displacement between the land pattern and buried land of the film.

While the invention has been described by means of specific examples and specific embodiments, we do not wish to be limited thereto, for obvious modifications will occur to those skilled in the art without departing from the spirit and scope of the invention.

We claim:

1. A method of making a multilayer printed wiring board including a plurality of printed wiring boards, said method comprising the steps of
    providing a copper clad laminate with buried lands on a basic material consisting of glass fiber impregnated with resin and arranging copper foil with lands projecting in correspondence with land forming positions at a first side and a flat surface second side so that the projecting lands face the basic material side;

laminating copper foil and said basic material to provide a copper clad laminate;

etching said copper clad laminate to provide an intermediate layer substrate having a desired circuit including a land pattern and circuit conductors;

laminating a plurality of said intermediate layer substrates by thermal bonding with said basic material and applying pressure to the layers to provide a multilayer laminate;

boring through holes to specified lands of each layer of said multilayer laminate; and plating the through holes bored in said multilayer laminate upon completion of said boring.

2. A method as claimed in claim 1, wherein each of said printed wiring boards is made by forming a copper clad foil in a pattern for forming a wiring circuit with a pair of major surface areas opposite each other, and laminating said foil to said basic material with each of said major surface areas having a first level at a first distance from said basic material and a second level at a second distance from said basic material different from said first distance, the second levels of said major surface areas being at areas for forming lands where through holes are to be formed 3. A method as claimed in claim 2, wherein said foil is made by a first step of forming a copper foil on a temporary substrate, a second step of etching uniformly to a specific depth in an area other than the land forming positions of the copper foil, a third step of placing a pre-preg over the copper foil upon completion of the etching, a fourth step of printing the copper foil on the pre-preg by thermally bonding the temporary substrate and the pre-preg, and then removing the temporary substrate.

4. A method as claimed in claim 2, wherein said foil is made by a first step of forming a copper foil on a temporary substrate, a second step of plating copper in a specific thickness at the land forming positions on the copper foil, a third step of placing a pre-preg over the copper foil upon completion of the plating, a fourth step of printing the copper foil on the pre-preg by thermally bonding the temporary substrate and the pre-preg and then removing the temporary substrate.

5. A method of making a printed wiring board for forming a multilayer printed wiring board, said method comprising the steps of impregnating a fibrous material with resin to form a resinous base;

forming a copper foil on a temporary substrate;

covering said foil with a photo resist;

primarily exposing the photo resist via a mask film having common land patterns which are regularly arranged in the form of a matrix;

secondarily exposing the photo resist via a mask film having intrinsic circuit patterns including specified land patterns and circuit conductor patterns;

developing the twice-exposed photo resist other than specified land forming areas;

etching uniformly to a predetermined depth in areas other than the land forming areas of said foil;

placing a pre-preg over the copper foil upon completion of the etching;

printing the copper foil on the pre-preg by thermally bonding the temporary substrate and the pre-preg;

removing the temporary substrate thereby forming a copper clad foil in a pattern for forming a wiring circuit with a pair of major surface areas opposite each other; and laminating said foil to said base with each of said major surface areas having a first level at a first distance from said base and a second level at a second distance from said base different from said first distance, the second levels of said major surface areas being at areas for forming lands where through holes are to be formed.

6. A method as claimed in claim 5, said multilayer printed wiring board being made by laminating the mask film having common land patterns regularly arranged in the form of a matrix and the mask film having intrinsic circuit patterns including specified land patterns and circuit conductor patterns, and exposing the laminated mask films.

7. A method of making a printed wiring board for forming a multilayer printed wiring board, said method comprising the steps of impregnating a fibrous material with resin to form a resinous base;

forming a copper foil on a temporary substrate;

covering said foil with a photo resist;

primarily exposing the photo resist via a mask film having common land patterns which are regularly arranged in the form of a matrix;

secondarily exposing the photo resist via a mask film having intrinsic circuit patterns including specified land patterns and circuit conductor patterns;

developing the twice-exposed photo resist other than specified land forming areas of said foil;

removing the resist at the specified land forming areas;

plating only the land forming areas of said foil;

placing a pre-preg over the copper foil upon completion of the plating;

printing the copper foil on the pre-preg by thermally bonding the temporary substrate and the pre-preg;

removing the temporary substrate thereby forming a copper clad foil in a pattern for forming a wiring circuit with a pair of major surface areas opposite each other; and laminating said foil to said base with each of said major surface areas having a first level at a first distance from said base and a second level at a second distance from said base different from said first distance, the second levels of said major surface areas being at areas for forming lands where through holes are to be formed.

8. A method as claimed in claim 7, said multilayer printed wiring board being made by laminating the mask film having common land patterns regularly arranged in the form of a matrix and the mask film having intrinsic circuit patterns including specified land patterns and circuit conductor patterns, and exposing the laminated mask films.

* * * * *